Jan. 10, 1967 R. B. PITTMAN 3,297,974

RECEPTACLE FOR INTEGRATED CIRCUIT MODULE

Filed April 15, 1965 3 Sheets-Sheet 1

INVENTOR
ROBERT B. PITTMAN

BY James and Franklin
ATTORNEYS

Jan. 10, 1967 R. B. PITTMAN 3,297,974
RECEPTACLE FOR INTEGRATED CIRCUIT MODULE
Filed April 15, 1965 3 Sheets-Sheet 2

INVENTOR
ROBERT B. PITTMAN
BY James and Franklin
ATTORNEYS

INVENTOR
ROBERT B. PITTMAN
BY *James and Franklin*
ATTORNEYS 3,297,974
Patented Jan. 10, 1967

3,297,974
RECEPTACLE FOR INTEGRATED CIRCUIT MODULE

Robert B. Pittman, River Edge, N.J., assignor to Industrial Electronic Hardware Corporation, New York, N.Y., a corporation of New York Filed Apr. 15, 1965, Ser. No. 448,483
15 Claims. (Cl. 339—17)

This invention relates to printed circuitry using integrated circuit modules, and more particularly to a receptacle for releasably receiving a module of the flat pack type.

Integrated circuit modules of the flat pack type are growing in popularity. These modules usually have flat leads projecting in opposite directions in one plane, and usually are secured to a printed circuit board by soldering the leads directly to printed circuit lines on the board. However, the heat of soldering may affect the solid state components in the module.

The diminutive size aggravates handling problems, and the close lead spacing as well as the fragile nature of the leads introduce considerable difficulty in handling and soldering, and even greater difficulty in attempting to replace a module. If the module is to be mounted on the blank side of the board it is necessary to bend the leads to pass through holes in the board, and this bending is difficult because of the small size, and may injure the module.

The primary object of the present invention is to overcome the foregoing difficulties. For this purpose I provide a flat openable receptacle which releasably receives the flat pack module without soldering. The receptacle itself may be soldered to a printed circuit board, but the module is not, and therefore may be replaced readily. Moreover, the receptacle preferably is empty when being soldered to the printed circuit board, and therefore the module is never subjected to the heat of soldering.

A more specific object of the invention is to provide such a receptacle in two forms, one adapted for mounting on the blank side of a printed circuit board, and the other adapted for mounting on the printed side of the circuit board.

To accomplish the foregoing general objects, and other more specific objects which will hereinafter appear, my invention resides in the receptacle elements and their relation to a flat pack module and a printed circuit board, as are hereinafter more particularly described in the following specification. The specification is accompanied by drawings in which.

Figures 1, 2, 3:
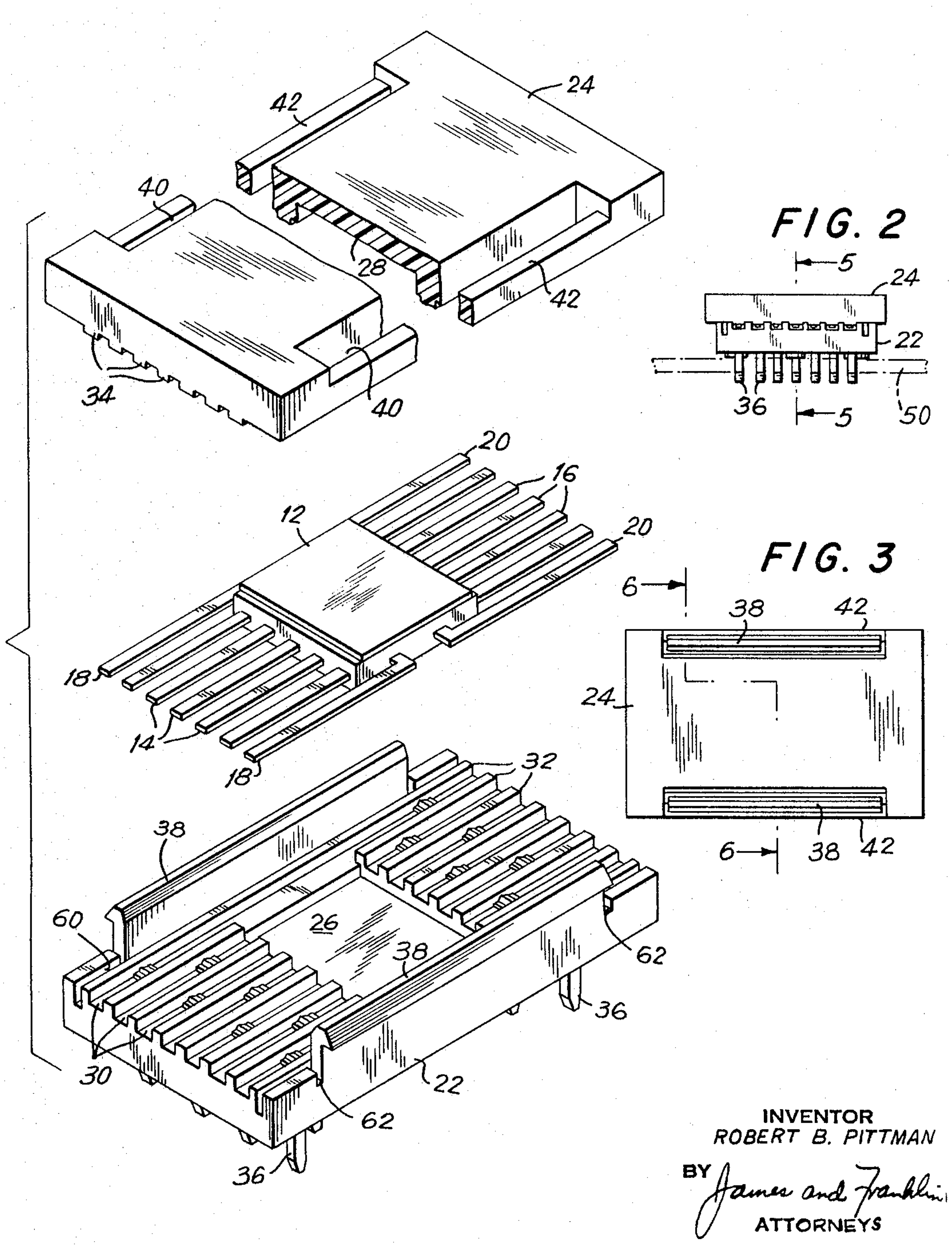
FIG. 1 is an exploded perspective view drawn to enlarged scale and showing a receptacle and a flat pack module to be received therein.
FIG. 2 is an end view of the assembly in closed condition.
FIG. 3 is a top plan view of the assembly.

Referring to the drawing, and more particularly to FIG. 1, the integrated circuit module 12 is of the flat pack type and has collateral flat leads 14 and 16 extending in opposite directions. The leads are in a common plane, as shown. The drawing is made to greatly enlarged scale, because the body of module 12 is only ¼" square in size. In the particular form here shown there are fourteen leads, but a module of the same size is also made with ten leads, in which case the endmost leads 18 and 20 are omitted. Such modules contain solid state circuitry for a logic block, or for a gate in a computer, or for other such apparatus. Voltage regulators and other devices have been made in this integrated flat pack form.

Usually the module is secured to printed circuit lines on a printed circuit board by soldering the leads 14 and 16 directly to the printed lines on the board.

Figure 5:
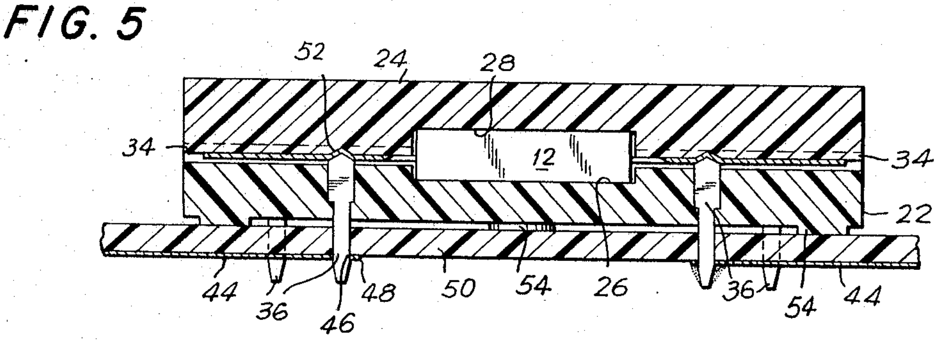
FIG. 5 is a longitudinal section drawn to enlarged scale and taken approximately on the line 5—5 of FIG. 2.

In accordance with the present invention, I provide a receptacle comprising a molded plastic bottom part 22 and a mating molded plastic top part 24. These parts are hollowed as shown at 26 and 28 in FIG. 1, to provide a compartment dimensioned to receive the body 12 of the module. The location of the module 12 in the hollowed receptacle is also shown in FIG. 5.

One of the two parts, preferably the bottom part 22, is longitudinally channeled as shown at 30 and 32 in FIG. 1, to receive the flat leads of the module. In preferred form, the top part 24 has longitudinal beads 34 which are received in the channels 30 and 32 over the leads. This makes possible the use of deep channels which safely confine the leads.

The bottom part 22 has short conductive elements 36 secured transversely therethrough, there being one such element for each channel and therefore for each lead. The upper end of the element 36 projects into its channel to engage the lead in that channel, and the lower end projects from the bottom of the receptacle for electrical connection to a printed circuit line. To complete the receptacle it is provided with means to detachably secure the top part 24 to the bottom part 22, with the module 12 therebetween.

Figure 6:
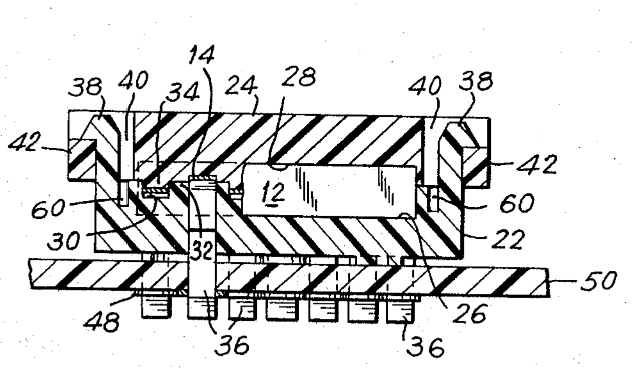
FIG. 6 is a transverse section drawn to enlarged scale and taken approximately on the stepped line 6—6 of FIG. 3.

In preferred form the bottom part 22 has elongated integrally molded hooks 38 extending longitudinally of the receptacle at its side edges, and the top part 24 has mating slots 40 to receive the hooks with a snap engagement. The marginal portions of the top are preferably reduced in height to leave bars 42. The hooks 38 then are received flush with or even below the top of part 24. The slots 40 have clearance behind the hooks, as shown in FIG. 6, so that the hooks have room to bend inward when the parts are being assembled. The hooks then spring outward to their normal position shown in FIG. 6.

The receptacle shown in FIGS. 1–6 is intended to be permanently mounted on the blank side of a printed circuit board. The connection elements 36 therefor terminate in pins which project downwardly far enough to pass through holes in the printed circuit board for soldering to printed circuit lines on the opposite side of the board. The elements 36 in the successive channels are preferably offset or staggered in alternation, as will be clear from inspection of FIGS. 1 and 4.

Figure 7:
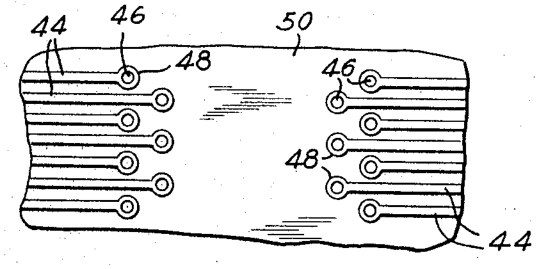
FIG. 7 is a bottom plan view of a fragment of a printed circuit board prepared to receive the receptacle of FIGS. 1–6 on the blank or top side of the board.

FIG. 7 shows the printed circuit lines on the bottom of the board, prepared to receive the receptacle. The board has fourteen holes for the fourteen pins, and a printed circuit line 44 extends to each hole 46. The spacing of the leads is small, say 0.050 inch. The printed area is preferably enlarged around each hole, as shown at 48, and it is for this reason that it is preferred to stagger the location of the alternate pins, because that provides additional room for the enlargements 48.

FIGS. 5 and 6 show how the pins 36 pass through the printed board 50 preparatory to soldering to the printed lines 44 with their enlargements 48. The solder is not shown except at one pin. It will be understood that the solder may be applied by known techniques such as dip soldering, or wave soldering, or the use of small annular pellets of solder with subsequent heating. The solder serves not only for electrical connection, but also to hold the receptacle on the printed circuit board. The module and the top of the receptacle may be added later, without solder.

In FIG. 5 it will be seen that the bead 34 is deformed as shown at 52 over the pin 36. This helps assure good electrical contact under the pressure provided by the hook engagement when the top part is applied forcibly to the bottom part of the receptacle.

Figure 4:
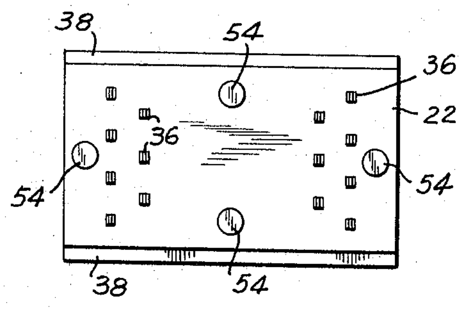
FIG. 4 is a bottom plan view of the assembly.
Figure 8:
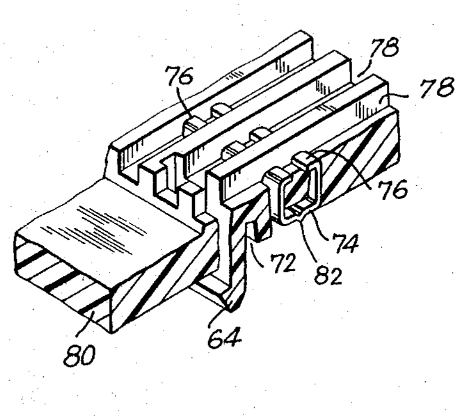
FIG. 8 is a fragmentary perspective view of the bottom part of a receptacle designed to be mounted on the printed side of a circuit board.

Referring to FIGS. 4, 5, and 6, the bottom part 22 may be and preferably is provided with short support studs or feet 54. These space the bottom 22 of the receptacle from the circuit board 50, which is of some advantage for circulation of air and cooling.

To release or replace a flat pack module the receptacle is opened, and referring to FIG. 6 it will be evident that the hooks 38 are exposed and may be pressed toward one another with one's fingers. Alternatively, one hook may be moved back until its side of the top part 24 is released; whereupon the other side is readily disengaged from its hook. The bottom part 22 preferably is slotted downward at 60 (FIG. 6) immediately behind the hooks 38 to lengthen the vertical dimension of the hooks, and thereby to increase their flexibility. The ends of the hooks are also freed, as shown at 62 in FIG. 1.

Figure 9:
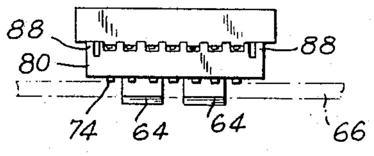
FIG. 9 is an end view of the complete assembly.
Figure 10:
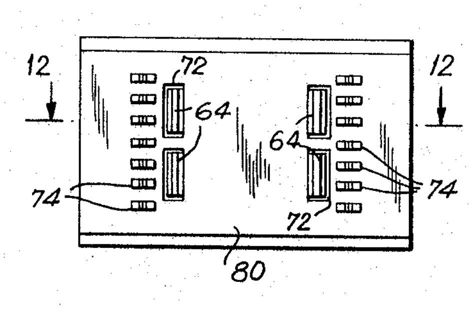
FIG. 10 is a bottom plan view of the assembly.
Figure 11:
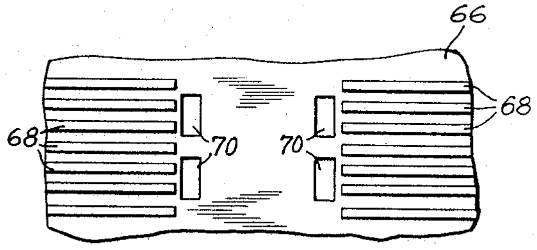
FIG. 11 is a top plan view of a printed circuit board prepared to receive the receptacle of FIGS. 8–10.
Figure 12:
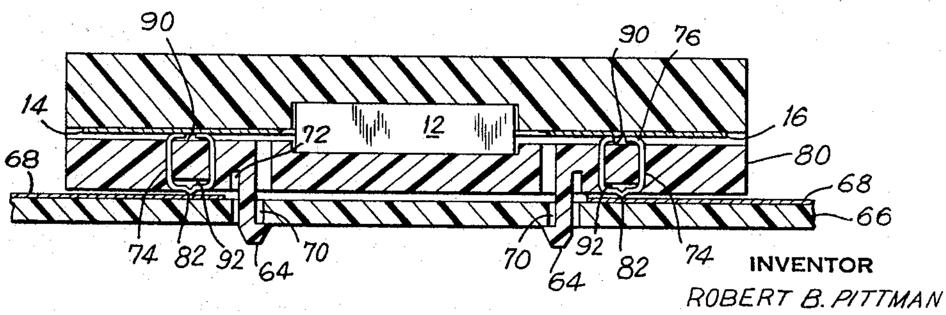
FIG. 12 is a longitudinal section drawn to enlarged scale and taken approximately on the line 12—12 of FIG. 10.

As so far described, the receptacle is intended for mounting on the blank side of the board. In FIGS. 8–12 I show a modified form of receptacle which is intended to be mounted on the printed side of the board. The top part of the receptacle may be made the same as before, and requires no further description. In the bottom part one main difference is the provision of hooks 64 preferably molded integrally with the bottom part 80. In the present case there are four such hooks located as shown in FIG. 10. FIG. 11 shows a part of a printed circuit board 66 with fourteen collateral circuit lines 68 suitably dimensioned and spaced to receive the receptacle shown in FIGS. 8–12. In this case the board is prepared by the provision of four slots 70 which receive the four hooks 64 shown in FIG. 10. The relation of the parts when assembled is shown in FIGS. 9 and 12, the hooks 64 being received through the slots 70 with a snap engagement. To increase their yieldability the material may be slotted or cut away behind the hooks, as shown at 72 in FIGS. 8 and 10 and 12.

The transverse metal connection elements in this case are preferably clinched staples 74, instead of the solid pins shown at 36 in FIGS. 1–7. The bent ends 76 of the staples are disposed in the channels 78 which receive the flat leads of the module. The lower ends of the staples are recessed upward somewhat into the bottom part 80 of the receptacle, and are preferably deformed to provide projections 82 which bear directly against the printed lines 68 of the circuit board to insure good electrical contact. The tops of the staples bear against the flat leads 14 and 16 of the module 12, as is best shown in FIG. 12.

The force for contact between the top of the staple and its superposed lead is provided by the long edge hooks (88 in FIG. 9) which are exactly like the hooks 38 shown in FIG. 1, and which similarly are inwardly yieldable when the parts are being assembled or disassembled. The force for electrical contact between the bottom of the staple and its printed circuit line is provided by the hooks 64 engaging the bottom of the printed board 66. The staples are somewhat resilient and yieldable, which helps maintain good electrical contact. Because of rounded corners some clearance remains after clenching, as shown at 90 and 92 in FIG. 12.

It will be understood that the receptacle may be made in a number of sizes to receive different modules. It has already been mentioned that the ¼" module shown in FIG. 1 is made with either ten or fourteen leads. A slightly larger module has been made with an area ¼" x ⅜", and with eight leads from each of the longer edges (sixteen in all). A module has also been made which is ¼" x ⅛" in area and with ten leads, five from each of the longer edges.

The plastic material used may vary and will depend largely upon the environment. Nylon is a good all-around plastic for the present purpose. High-density polyethylene is suitable, and also the more recently developed polycarbonates. If high temperatures are to be encountered it may be preferred to use Teflon.

In some cases the manufacturer of the module may prefer to package the module in the receptacle before shipping the same to its customer and, in such case the customer may prefer to apply the receptacle to the printed board without first removing the module. In the second form of the invention there is no soldering at all, and in the first form of the invention the soldering may be performed by "wave soldering" which is very rapid, and that fact, together with the remote connection of the module and the air cooling space beneath the receptacle, makes it feasible to solder without injuring the module.

It is believed that the construction and method of use of my receptacle for integrated circuit modules of the flat pack type, as well as the advantages thereof, will be apparent from the foregoing detailed description. It will also be apparent that while I have shown and described the invention in several preferred forms, changes may be made without departing from the scope of the invention, as sought to be defined in the following claims.

I claim:

1. A receptacle for releasably mounting an integrated circuit module of the flat pack type on a printed circuit board, said module having collateral leads, said receptacle comprising a molded plastic bottom part, and a mating molded plastic top part, said parts being hollowed to receive the body of the module, one of said parts outside said hollow being longitudinally channeled to receive the leads of the module, short conductive elements secured through the bottom part in a direction which is transverse to the flat faces of the module and to the printed circuit board, there being one such element for each channel, the upper end of said element projecting into the channel to engage a lead for electrical contact, the lower end of said element projecting from the bottom of the receptacle for electrical connection to a printed circuit line on the printed circuit board, and means detachably securing the top part to the bottom part with a module therebetween.

2. A receptacle for releasably mounting an integrated circuit module of the flat pack type on a printed circuit board, said module having collateral leads extending in opposite directions, said receptacle comprising a molded plastic bottom part, and a mating molded plastic top part, said parts being hollowed to receive the body of the module, the bottom part outside said hollow being longitudinally channeled to receive the leads of the module, short conductive elements secured through the bottom part in a direction which is transverse to the flat faces of the module and to the printed circuit board, there being one such element for each channel, the upper end of said element projecting into the channel to engage a lead for electrical contact, the lower end of said element projecting from the bottom of the receptacle for electrical connection to a printed circuit line on the printed circuit board, and means detachably securing the top part to the bottom part with a module therebetween.

3. A receptacle for releasably mounting an integrated circuit module of the flat pack type on a printed circuit board, said module having collateral flat leads extending in opposite directions, said receptacle comprising a molded plastic bottom part, and a mating molded plastic top part, said parts being hollowed to receive the body of the module, the bottom part outside said hollow being longitudinally channeled to receive the flat leads of the module, short conductive elements secured through the bottom part in a direction which is transverse to the flat faces of the module and to the printed circuit board, there being one such element for each channel, the upper end of said element projecting into the channel to engage a flat lead for electrical contact, the lower end of said element projecting from the bottom of the receptacle for electrical connection to a printed circuit line on the printed circuit board, and means detachably securing the top part of the bottom part with a module therebetween, said means being integrally molded hooks on one part and mating surfaces on the other part to receive said hooks.

4. A receptacle for releasably mounting an integrated circuit module of the flat pack type on a printed circuit board, said module having collateral flat leads extending in opposite directions, said receptacle comprising a molded plastic bottom part, and a mating molded plastic top part, said parts being hollowed to receive the body of the module, the bottom part outside said hollow being longitudinally channeled to receive the flat leads of the module, the top part having longitudinal beads which fit in said channels over said leads, short conductive elements secured through the bottom part in a direction which is transverse to the flat faces of the module and to the printed circuit board, there being one such element for each channel, the upper end of said element projecting into the channel to engage a flat lead for electrical contact, the lower end of said element projecting from the bottom of the receptacle for electrical connection to a printed circuit line on the printed circuit board, and means detachably securing the top part to the bottom part with a module therebetween, said means integrally molded hooks on the bottom part extending longitudinally of the receptacle at its side edges, and mating slots on the top part to receive said hooks.

5. A receptacle as defined in claim 1 for use on the blank side of a printed circuit board, in which receptacle the conductive elements in the bottom part are pins which project from the bottom part far enough to pass through holes in a printed circuit board for soldering to printed circuit lines on the opposite side of the board, said soldering serving for electrical contact and for mechanical attachment of the receptacle to the board.

6. A receptacle as defined in claim 3 for use on the blank side of a printed circuit board, in which receptacle the conductive elements in the bottom part are pins which project from the bottom part far enough to pass through holes in a printed circuit board for soldering to printed circuit lines on the opposite side of the board, said soldering serving for electrical contact and for mechanical attachment of the receptacle to the board.

7. A receptacle as defined in claim 2 for use on the blank side of a printed circuit board, in which receptacle the conductive elements in the bottom part are pins which project from the bottom part far enough to pass through holes in a printed circuit board for soldering to printed circuit lines on the opposite side of the board, said soldering serving for electrical contact and for mechanical attachment of the receptacle to the board, the location of pins in successive channels being offset or staggered.

8. A receptacle as defined in claim 4 for use on the blank side of a printed circuit board, in which receptacle the conductive elements in the bottom part are pins which project from the bottom part far enough to pass through holes in a printed circuit board for soldering to printed circuit lines on the opposite side of the board, said soldering serving for electrical contact and for mechanical attachment of the receptacle to the board, the location of pins in successive channels being offset or staggered.

9. A receptacle as defined in claim 1 for use on the printed side of a printed circuit board, said receptacle having hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines.

10. A receptacle as defined in claim 3 for use on the printed side of a printed circuit board, said receptacle having hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines.

11. A receptacle as defined in claim 2 for use on the printed side of a printed circuit board, said receptacle having integrally molded hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines.

12. A receptacle as defined in claim 4 for use on the printed side of a printed circuit board, said receptacle having integrally molded hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines.

13. A receptacle as defined in claim 2 for use on the printed side of a printed circuit board, said receptacle having hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines, and in which the said conductive elements are metal staples passing through and clinched on the bottom part of the receptacle.

14. A receptacle as defined in claim 4 for use on the printed side of a printed circuit board, said receptacle having integrally molded hook shaped elements projecting from the bottom thereof and dimensioned to pass through mating slots in the printed circuit board and to hold the bottom part tightly against the printed circuit board, and in which the conductive elements passing through the bottom part project only slightly from the bottom part for direct electrical contact with subjacent printed circuit lines, and in which the said conductive elements are metal staples passing through and clinched on the bottom part of the receptacle.

15. A relatively thin flat receptacle for releasably mounting an integrated circuit module of the flat pack type on a printed circuit board, said module having collateral leads projecting from one or more of its edges, said receptacle comprising a molded plastic bottom part, and a mating molded plastic top part, said parts being hollowed to receive the flat body of the module with its faces of large area disposed substantially parallel to the printed circuit board, said receptacle parts being separable on a parting face which is substantially parallel to the printed circuit board, one of said parts outside said hollow being longitudinally channeled to receive the collateral leads of the module, means detachably securing the top part to the bottom part with a module therebetween, and means to secure the receptacle on a circuit board and to provide electrical contact between the leads and the printed lines on the board.

References Cited by the Examiner

UNITED STATES PATENTS

| | | | |
|---|---|---|---|
| 3,076,165 | 1/1963 | Weyrick | 337—17 |
| 3,205,408 | 9/1965 | Boehm et al. | 317—101 |

ROBERT K. SCHAEFER, *Primary Examiner.*

W. C. GARVERT, *Assistant Examiner.*